United States Patent
Skinner et al.

(10) Patent No.: US 9,608,627 B2
(45) Date of Patent: Mar. 28, 2017

(54) WELL TOOL HAVING OPTICAL TRIGGERING DEVICE FOR CONTROLLING ELECTRICAL POWER DELIVERY

(71) Applicant: HALLIBURTON ENERGY SERVICES, INC., Houston, TX (US)

(72) Inventors: Neal G. Skinner, Lewisville, TX (US); David P. Sharp, Houston, TX (US)

(73) Assignee: Halliburton Energy Services, Houston, TX (US)

( * ) Notice: Subject to any disclaimer, the term of this patent is extended or adjusted under 35 U.S.C. 154(b) by 176 days.

(21) Appl. No.: 13/748,736

(22) Filed: Jan. 24, 2013

(65) Prior Publication Data

US 2014/0203174 A1 Jul. 24, 2014

(51) Int. Cl.
| | | |
|---|---|---|
| *G01J 1/04* | (2006.01) |
| *H03K 17/78* | (2006.01) |
| *H01J 40/14* | (2006.01) |
| *E21B 41/00* | (2006.01) |
| *H03K 17/52* | (2006.01) |
| *H04B 10/80* | (2013.01) |

(52) U.S. Cl.
CPC ......... *H03K 17/78* (2013.01); *E21B 41/0085* (2013.01); *H03K 17/52* (2013.01); *H04B 10/807* (2013.01); *H02J 50/30* (2016.02)

(58) Field of Classification Search
CPC .. H03K 17/78; H01L 27/1446; H01L 31/1136
USPC ......... 250/214, 214 SW, 214 R, 216, 227.11, 250/227.23; 166/244.1, 248, 250.01; 73/152.01
See application file for complete search history.

(56) References Cited

U.S. PATENT DOCUMENTS

| | | | | |
|---|---|---|---|---|
| 3,723,887 A | * | 3/1973 | Panico | 327/374 |
| 3,939,379 A | * | 2/1976 | Sullivan et al. | 315/85 |
| 4,079,390 A | | 3/1978 | Iwata et al. | |
| 4,295,058 A | * | 10/1981 | Lade et al. | 307/117 |
| 4,538,140 A | | 8/1985 | Prestel | |
| 4,870,902 A | | 10/1989 | Simon et al. | |
| 5,099,144 A | * | 3/1992 | Sai | 250/551 |
| 5,682,134 A | | 10/1997 | Stallbohm | |

(Continued)

FOREIGN PATENT DOCUMENTS

WO   2013/182804   11/2013

OTHER PUBLICATIONS

International Search Report and Written Opinion issued Apr. 21, 2014 for PCT Patent Application No. PCT/US2014/010707, 16 pages.

(Continued)

*Primary Examiner* — Pascal M Bui-Pho
(74) *Attorney, Agent, or Firm* — Benjamin Fite; Tumey L.L.P.

(57) ABSTRACT

A method of controlling electrical power delivery to a well tool can include transmitting trigger light via an optical waveguide to a circuit in a well, and the circuit delivering the electrical power to the well tool in response to the circuit receiving the trigger light. A circuit for supplying electrical power to at least one well tool can include a photodiode which receives light from an optical waveguide in a well, a voltage increaser which increases a voltage output by the photodiode, and an electrical energy storage device which receives electrical energy via the voltage increaser, whereby the electrical power can be supplied to the downhole well tool from the storage device.

4 Claims, 10 Drawing Sheets

(56) References Cited

U.S. PATENT DOCUMENTS

| | | | |
|---|---|---|---|
| 6,874,361 | B1 | 4/2005 | Meltz et al. |
| 2002/0039465 | A1* | 4/2002 | Skinner .......................... 385/15 |
| 2002/0109080 | A1 | 8/2002 | Tubel et al. |
| 2003/0010495 | A1 | 1/2003 | Mendez et al. |
| 2003/0020631 | A1 | 1/2003 | Haase et al. |
| 2003/0043055 | A1* | 3/2003 | Schultz ............... E21B 41/0085 340/856.3 |
| 2003/0197849 | A1 | 10/2003 | Ishikawa et al. |
| 2003/0205083 | A1 | 11/2003 | Tubel et al. |
| 2004/0069069 | A1 | 4/2004 | Gysling et al. |
| 2004/0141420 | A1 | 7/2004 | Hardage et al. |
| 2005/0001151 | A1* | 1/2005 | Nakazawa ......... H04B 10/6911 250/214 R |
| 2007/0062696 | A1* | 3/2007 | Wilson ................. G01V 11/002 166/254.2 |
| 2008/0223129 | A1 | 9/2008 | Gysling et al. |
| 2008/0247273 | A1 | 10/2008 | Chemali et al. |
| 2009/0114013 | A1 | 5/2009 | DiFoggio |
| 2010/0025032 | A1* | 2/2010 | Smith et al. ............... 166/244.1 |
| 2010/0107754 | A1 | 5/2010 | Hartog et al. |
| 2010/0207019 | A1 | 8/2010 | Hartog et al. |
| 2011/0030467 | A1 | 2/2011 | Bakulin |
| 2011/0088462 | A1 | 4/2011 | Samson et al. |
| 2011/0090496 | A1 | 4/2011 | Samson et al. |
| 2012/0132417 | A1 | 5/2012 | Dria et al. |

OTHER PUBLICATIONS

International Search Report and Written Opinion issued May 2, 2014 for PCT Patent Application No. PCT/US2014/010696, 17 pages.
International Search Report and Written Opinion issued Apr. 30, 2014 for PCT Application No. PCT/US2014/010862, 18 pages.
International Search Report and Written Opinion issued Jun. 24, 2014 for PCT Application No. PCT/US2014/010717, 15 pages.
Mouser Electronics; "Bourns 2027-07-SM-LF", web page via http://www.mouser.com, dated Jan. 8, 2013, 2 pages.
Bourns; "2027-xx-SM Precision Gas Discharge Tube Surge Protector", customer product information, dated Jul. 27, 2011, 3 pages.
Wikipedia; "Gas-filled tube", definition via http://en.wikipedia.org/Gas-filled_tube, dated Dec. 17, 2012, 9 pages.
JDSU; "Photovoltaic Power Converters", web page via http://www.jdsu.com, dated 2012, 1 page.
Pico Electronics; "Series A/SM Surface Mount and Plug-In", web page via http://www.picoelectronics.com, dated Jan. 8, 2013, 6 pages.
John Pasley; "Pulse Power Switching Devices", product overview via http://www.electronicstuff.co.uk, dated Sep. 24, 1996, 11 pages.
Mide; "Piezoelectric Sensor & Actuator: The QuickPack Advantage" product overview via http://www.mide.com, dated Jan. 8, 2013, 2 pages.
Robert McKee, et al.; "Acoustic in Pumping Systems", research tutorial, dated 2009, 6 pages.
Specification and Drawings for U.S. Appl. No. 13/748,749, filed Jan. 24, 2013, 29 pages.
Specification and Drawings for U.S. Appl. No. 13/748,720, filed Jan. 24, 2013, 30 pages.
Specification and Drawings for U.S. Appl. No. 13/748,764, filed Jan. 24, 2013, 46 pages.
Bakulin et al.; "Acoustic Surveillance of Production Impairment With Real-Time Completion Monitoring", SPE 112301, Feb. 13-15, 2008, 12 pages.
Bakulin et al.; "Real-Time Completion Monitoring with Acoustic Waves", Geophysics, vol. 73, No. 1, p. E15-E33, dated Jan.-Feb. 2008, 19 pages.
Fundamentals of Acoustics: Third edition edited by Lawrence E. Kinsler, Austin R. Frey, Alan B. Coppens, and James V. Sanders, John Wiley & Sons publication, dated Jan. 1980. Book mailed to USPTO Jun. 13, 2013.
Australian Patent Examination Report No. 1 for Australian Patent Application No. 2014209780 dated Feb. 26, 2016.
Canadian Search Report for Canadian Application No. 2,896,108 dated Jun. 17, 2016.
Society of Petroleum Engineers of AIME; "Case History of Large-Volume Fracture Stimulations in a West Texas Waterflood", SPE 11930, dated Oct. 5-8, 1983, 9 pages.
Halliburton; "HalSonics Firing Head", product overview via www.halliburton.com, dated 2013, 1 page.

* cited by examiner

WELL TOOL HAVING OPTICAL TRIGGERING DEVICE FOR CONTROLLING ELECTRICAL POWER DELIVERY

BACKGROUND

This disclosure relates generally to equipment utilized and operations performed in conjunction with a subterranean well and, in an example described below, more particularly provides a well tool with an optical triggering device for controlling electrical power delivery.

Distributed sensing with optical waveguides (such as optical fibers) has provided operators with enhanced information regarding parameters of interest in wells. For example, distributed optical sensing can enable measurement and analysis of temperature profiles along a wellbore, acoustic signal, vibration and/or strain sensing in a well, etc.

Typically, in distributed optical sensing, light is launched into an optical waveguide, and one or more different types of backscattering in the waveguide are detected as indications of certain parameters along the waveguide. For example, Raman backscattering (including Stokes and anti-Stokes components) may be detected as an indication of temperature, coherent Rayleigh backscattering may be detected as an indication of acoustic vibration of the waveguide, Brillouin backscattering may be detected as an indication of strain in the waveguide, etc.

It will be appreciated that advancements are continually needed in the art of implementing optical waveguides in wells.

DETAILED DESCRIPTION

Figure 1:
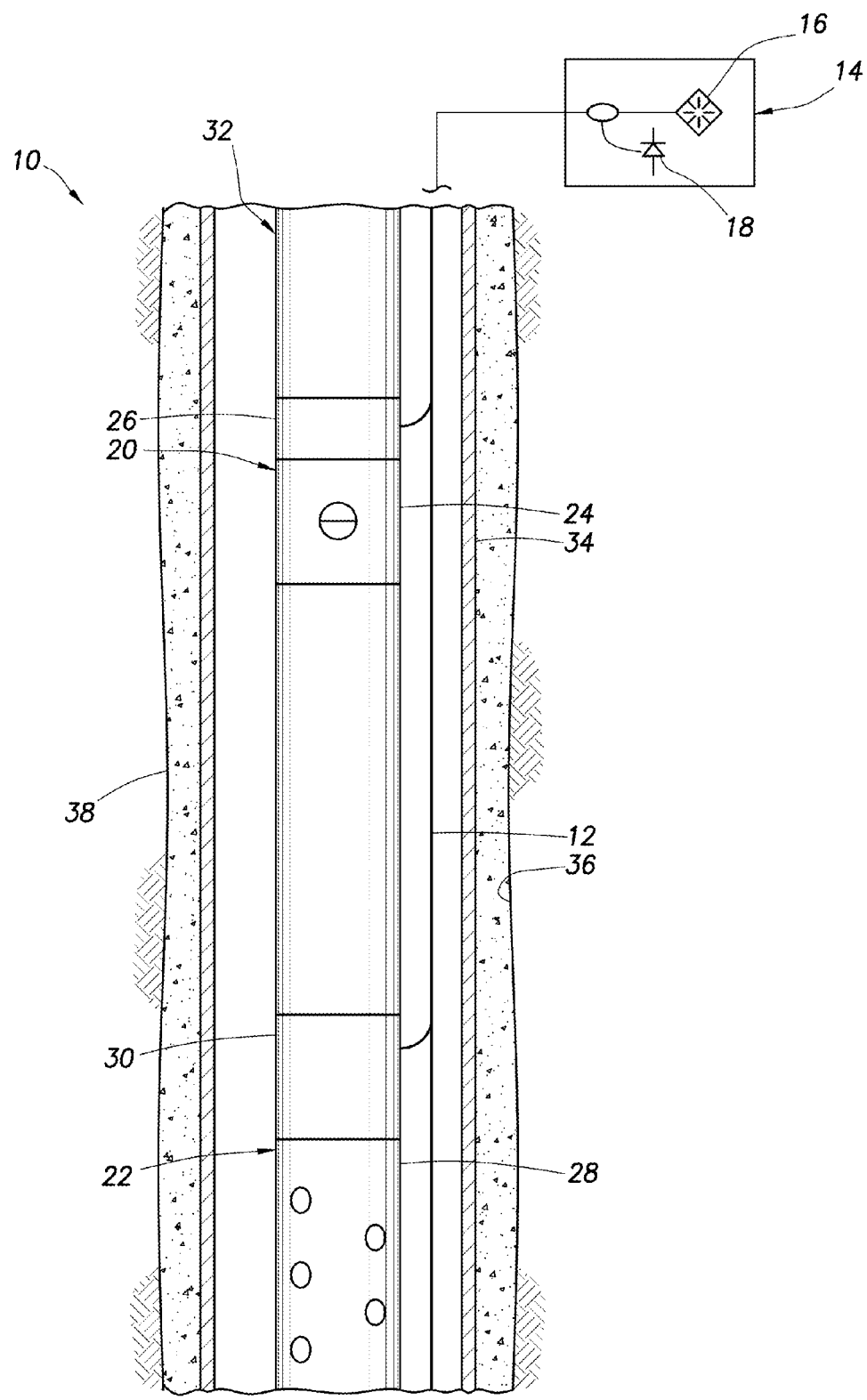
FIG. 1 is a representative partially cross-sectional view of a well system and associated method which can embody principles of this disclosure.

Representatively illustrated in FIG. 1 is a system 10 for use with a well, and an associated method, which system and method can embody principles of this disclosure. However, it should be clearly understood that the system 10 and method are merely one example of an application of the principles of this disclosure in practice, and a wide variety of other examples are possible. Therefore, the scope of this disclosure is not limited at all to the details of the system 10 and method described herein and/or depicted in the drawings.

In the FIG. 1 example, a cable 12, which includes at least one optical waveguide (such as, an optical fiber, an optical ribbon, etc.), is positioned in a well. The optical waveguide is used for measuring parameters in the well as distributed along the waveguide. For this purpose, the optical waveguide is connected to an interrogator 14 (including at least a light source 16 and a photo-detector 18).

The interrogator 14 launches pulses of light into the optical waveguide, and detects one or more types of backscatter in the waveguide. Characteristics of the backscattered light provide indications of parameters (such as, temperature, acoustic energy, vibration, strain) as distributed along the waveguide.

In one feature of the system 10, the light launched into the waveguide can also be used to provide electrical power to one or more well tools 20, 22 in the well. In the FIG. 1 example, the well tool 20 comprises a valve 24 having an electrical actuator 26, and the well tool 22 comprises a perforating gun 28 having an electrical firing head 30.

However, it should be clearly understood that other types of well tools (for example, sensors, packers, plugs, telemetry devices, etc.) may be provided with electrical power. The scope of this disclosure is not limited to use with any particular types of well tools.

The cable 12 is depicted in FIG. 1 as being positioned external to a tubular string 32 received in casing 34 which lines a wellbore 36. In other examples, the cable 12 could be external to the casing 34 (e.g., in cement 38 in an annulus between the casing and the wellbore 36), in an uncased or open hole, etc. The scope of this disclosure is not limited to any particular position of the cable 12 or optical waveguide therein.

The cable 12 can include lines other than the optical waveguide(s). Additional lines could include electrical or hydraulic lines. Any configuration of the cable 12 may be used, and any number or combination of lines may be used in the cable, in keeping with the scope of this disclosure.

While the cable 12 is being used to perform optical distributed parameter measurements along the wellbore 36, the light launched into the optical waveguide can also be used to generate electrical energy, which can be stored for later use in providing electrical power to operate the well tools 20, 22. Thus, small amounts of electrical energy are stored during the optical distributed parameter measurements and, when needed, the stored electrical energy is available, for example, as a controllably released high energy burst.

Of course, it is not necessary for the optical to electrical energy conversion and storage to be performed only when optical distributed parameter measurements are made. Virtually any time light is transmitted via the optical waveguide, the light can be used to generate electrical energy using the principles of this disclosure.

It also is not necessary for the stored electrical energy to be released only in short, high energy bursts. Electrical power at any desired level may be used, in keeping with the principles of this disclosure.

FIGS. 2-10 illustrate various examples of how, in a downhole environment (e.g., in the well of FIG. 1, in another wellbore, etc.), optical energy can be converted to electrical energy, which can be stored and controllably released, to provide usable electrical power to well tools. These objectives can be met while using relatively few electrical/electronic components, with those used being readily available in high temperature versions.

Figure 2:
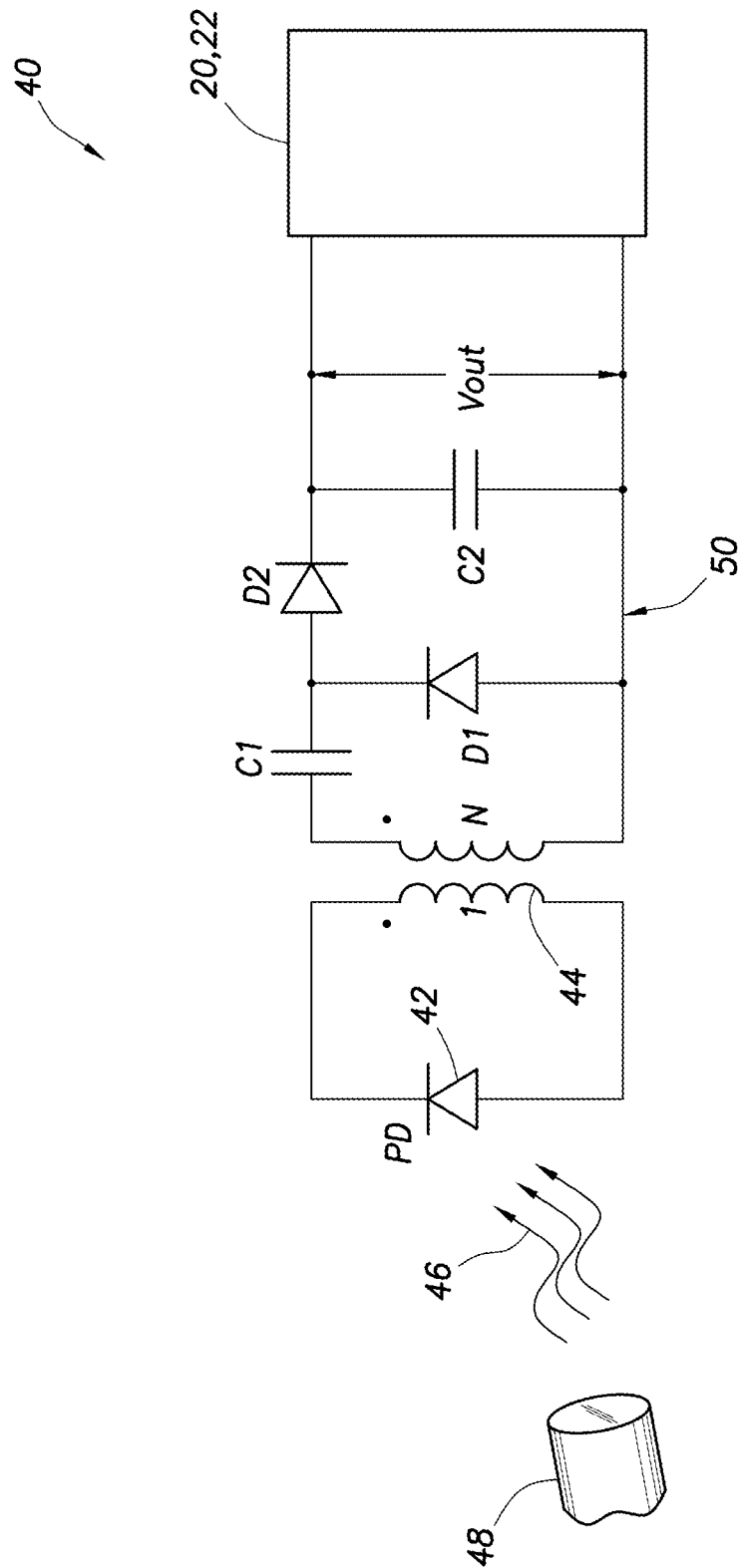
FIG. 2 is a representative electrical schematic for an optical to electrical converter which may be used in the system and method of FIG. 1.

FIG. 2 depicts a representative circuit diagram for a downhole optical to electrical energy converter and storage device 40. A photodiode 42 is connected to a step up transformer 44. The photodiode 42 is illuminated with pulsed light 46 carried downhole over an optical waveguide 48. The waveguide 48 could be an optical fiber included in the cable 12 in the system 10 of FIG. 1.

Voltage generated in the photodiode 42 from the incident light 46 is input into the transformer 44, where it may be stepped up or merely isolated from the photodiode. C1, C2, D1 and D2 make up a well-known alternating current to direct current (AC to DC) voltage doubler 50. DC voltage Vout across at an output of the voltage doubler 50 will be roughly twice an AC amplitude output from the transformer 44.

Any standard (preferably high-temperature) DC voltage regulator can be connected to Vout to produce a desired DC voltage output for supplying power to the well tools 20, 22. If higher voltage is required, the turns-ratio of the transformer 44 can be altered and/or additional voltage doublers 50 may be used.

Figure 3:
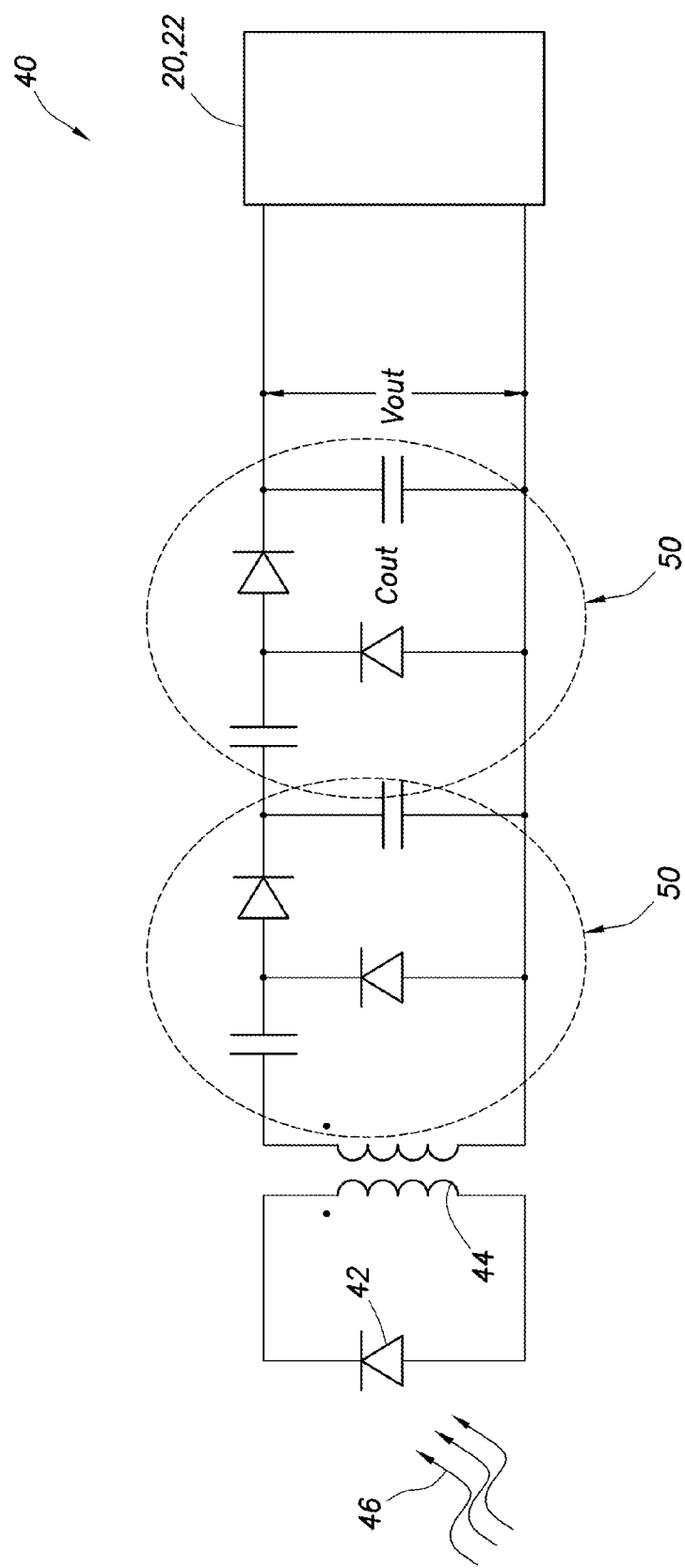
FIGS. 3-11 are representative electrical schematics for additional examples of the optical to electrical converter and an optical triggering device.

In FIG. 3, another example of the circuit 40 is depicted. In this example, two voltage doublers 50 (effectively a voltage quadrupler) are used. Note that, if a sufficient number of voltage doublers 50 is used, the step up transformer 44 may not be used.

Indeed, the transformer 44 and the voltage doubler 50 are only two examples of voltage increasers 52 (see FIGS. 5-10) which may be used to increase a voltage output by the photodiode 42. Voltage is not necessarily doubled in other examples. The scope of this disclosure is not limited to use of any particular type of voltage increaser.

The diodes D1 and D2 can in some examples comprise additional photodiodes (as the photodiode 42), so that the light 46 also causes electrical energy to be generated by the diodes D1 and D2.

There may be circumstances where one would want to limit the optical signals transmitted via the waveguide 48 that cause the circuit 40 to generate Vout. For example, if the circuit 40 powers an explosive device (such as, the perforating gun 28), it is preferable to ensure that only a very specific optical signal can operate the circuit 40, so that the explosive device is not accidently triggered.

Figure 4:
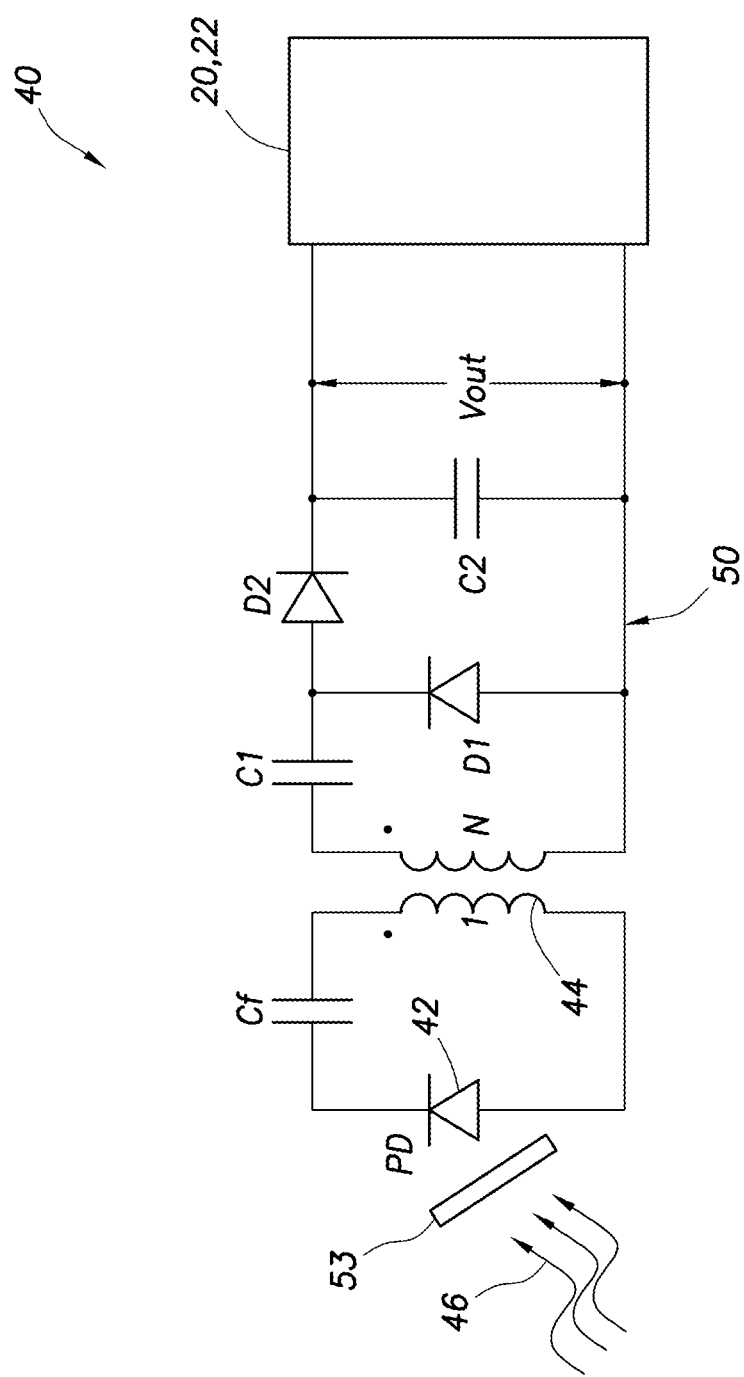

A similar situation is where multiple circuits 40 are illuminated by a single optical waveguide 48, and one wants to multiplex the circuits so that one or more selected circuits produce Vout without the others doing so. FIG. 4 depicts an example of the circuit 40 which provides security against accidental operation, and/or allows for multiplexing.

In the FIG. 4 example, an optical filter 53 is positioned between the light 46 and the photodiode 42. The filter 53 passes only a narrow range of wavelengths. Only when the specific range of wavelengths that match the pass band of the filter 53 are transmitted from the light source 16 will the circuit 40 produce Vout.

In other examples, the photodiode 42 may be selected so that it generates current only in response to a certain range of wavelengths. Thus, the scope of this disclosure is not limited to any particular way of preventing the circuit 40 from producing Vout when certain preselected wavelengths of light 46 are not transmitted.

FIG. 4 also depicts an additional capacitor, Cf in series with a primary winding of the transformer 44, forming an LC filter with resonance frequency equal to $\omega=1/\sqrt{LC_f}$ radians/second where L is the effective inductance of the transformer 44. This filter prevents the flow of current into the transformer 44 when the pulses illuminating the photodiode 42 are not at the resonant frequency. Other electric filters and filter topologies may be used to determine a laser pulse repetition rate required to activate a particular optical to electrical power converter. Wavelength division multiplexing and/or pulse frequency multiplexing can be added with only minor changes to the circuit 40. The scope of this disclosure is not limited to use with any particular filtering or multiplexing technique.

If D1 comprises a photodiode as mentioned above, then another optical filter could be used so that electrical power is generated by the D1 photodiode when another wavelength of light 46 is transmitted (other than in a wavelength pass band of the filter 53). The transmitting of light 46 having wavelengths which pass each of the filters can be timed, for example, so that a phase relationship is substantially equal to that of the transformer 44 and its resonant network. In the circuit 40 of FIG. 4, a nearly square wave transmission of the light 46 having the wavelengths which pass the filters would drive the circuit to supply electrical power to the well tools 20, 22.

In the above examples, pulsed optical power is converted into DC voltage, however there are some devices that do not operate on continuous power, but require short, high power pulses. In order to generate electrical pulses, the circuit 40 can be modified as shown in FIG. 5.

Figure 5:
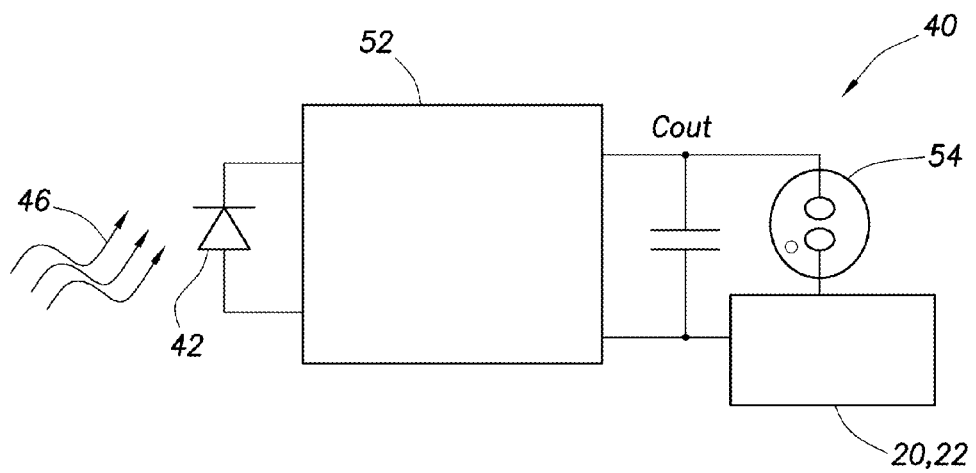

In FIG. 5, a voltage increaser 52 is depicted as representing any type of voltage increaser. For example, the voltage doubler 50, the step up transformer 44, any number or combination of these and/or other types of voltage increasers.

Cout is shown to the right of the voltage increaser 52. The total energy stored in the output capacitor Cout is $$\frac{1}{2} Cout\, Vout^2 \text{ Joules.}$$

Where Vout is controlled by the output voltage of the photodiode 42, and the configuration of the voltage increaser 52.

The well tool(s) 20, 22 to be supplied with electrical power are connected across Cout through a gas discharge tube (GDT) 54, a device that acts as an open switch until it reaches a threshold voltage differential, at which time it acts as a closed switch, dumping the electrical energy stored in Cout to the well tool. The circuit 40 described in FIG. 5 will deliver the electrical power to the well tool whenever the voltage across the GDT 54 reaches its threshold. This charging time will depend on the amplitude and frequency of the incident pulses of light 46, the size of capacitor Cout and internal leakage of the circuit 40 components. This makes timing of the delivery of electrical power through the GDT 54 to the well tools 20, 22 difficult to predict.

Figure 6:
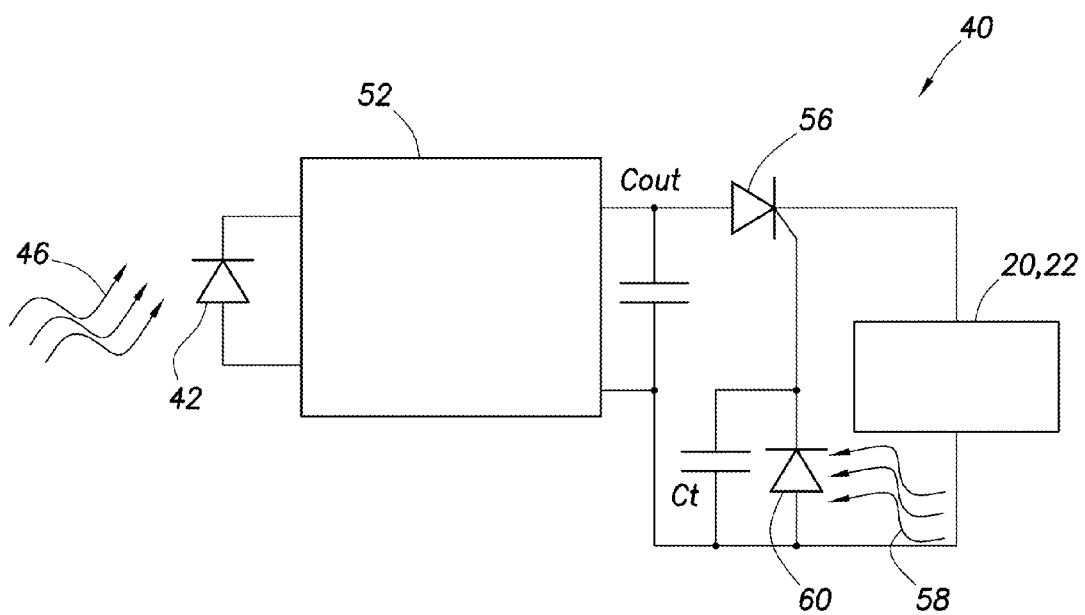

This limitation is mitigated by altering the circuit 40 further as shown in FIG. 6. In this example, the GDC 54 is replaced by, for example, a thyristor or SCR which are semiconductor devices which can be thought of as a switchable diode 56. An SCR is a diode with an additional gate. When the current flows into the gate, the diode acts normally, conducting only in the forward biased direction, however, when current is not injected into the gate, the diode does not conduct in either direction.

In order to trigger the circuit shown in FIG. 6 to supply electrical power to the well tool 20, 22 at a desired, controllable instant, a brief pulse of triggering light 58 illuminates a trigger photodiode 60. The trigger diode 60 generates a brief pulse of current that causes the SCR to dump most of the energy stored in Cout into the well tool 20, 22. The operating characteristics of an SCR are such that even if the trigger pulse light 58 is turned off, the SCR will conduct until all the energy stored in Cout is dumped to the well tool 20, 22.

The triggering light 58 can be controlled or filtered via wavelength or pulse frequency techniques as described above for the electrical power generating photodiode 42. For example, an LC filter could be connected to the output of the trigger photodiode 60, so that a predetermined repetition rate (frequency) of the trigger pulse light 58 is required to deliver power to the gate of the switchable diode 56.

Figure 7:
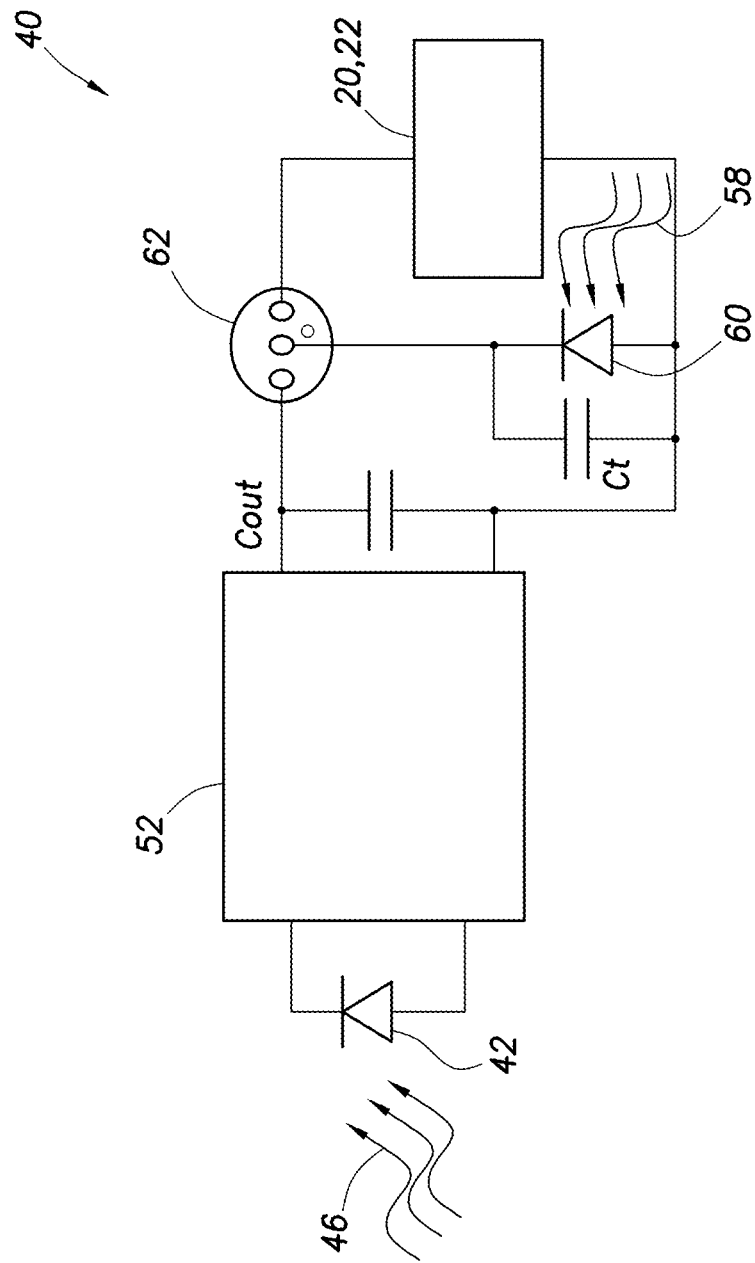

In yet another example depicted in FIG. 7, the SCR is replaced by a three lead neon tube 62 which can be considered as a trigger-able GDT. The triggering photodiode 60 is connected such that its output is used to trigger a gas discharge through the tube 62, whereby electrical power is provided to the well tool 20, 22.

In other examples, the trigger photodiode 60 may not be used. Instead, the trigger light 58 may be directed to the gas discharge tube 62, so that the trigger light excites gas in the tube to cause electrical power to be delivered to the well tools 20, 22. This technique may be used in any of the examples described herein, in which a gas discharge tube is used to control delivery of electrical power (e.g., the examples depicted in FIGS. 5 & 7-10).

Figure 8:
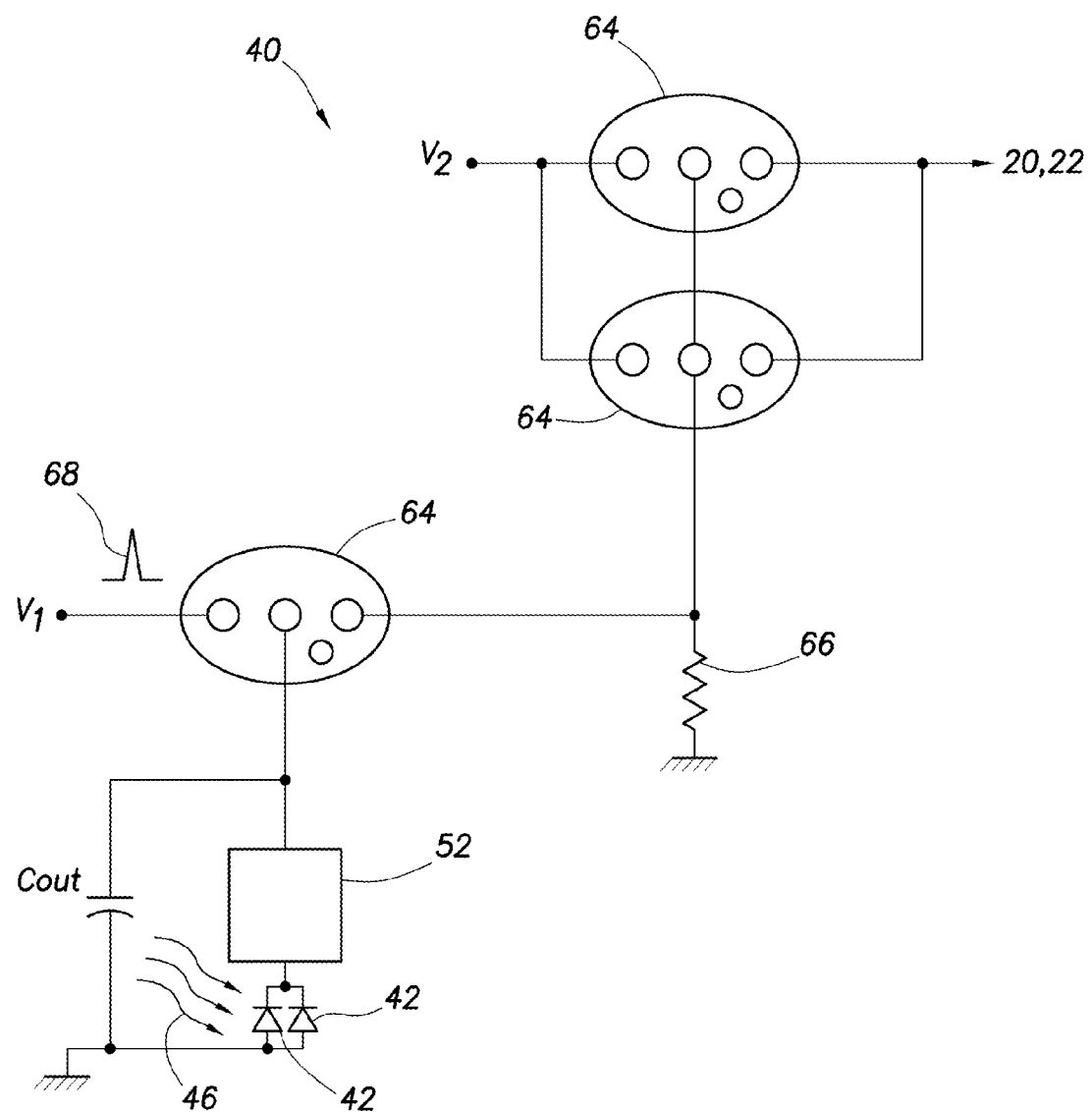

In FIG. 8, the neon tube 62 is replaced with another gas discharge tube 64. A gas discharge tube 64 comprises a gas tube with two or more electrodes and various gas mixtures to create controlled 'avalanche' conditions for large current flows triggered by small voltages. A two electrode tube 64 will have a maximum current (often up to 25K amps) and a rather narrow breakdown voltage. They can be 'selected' or 'matched' to get blocks of current or events to happen nearly synchronously and even isolated. Adding a third electrode can allow a small voltage (two electrodes are much closer than the third) across two to promulgate and include the third.

In the FIG. 8 example, DC voltage in $V_1$ goes to a three pin gas discharge tube 64 'far electrode'. Cout is connected to a 'near' pin and a low impedance (low resistance in this case) load 66 is connected to 'ground'. When Vout exceeds the threshold, the gas at the near pin excites relative to ground and includes the far pin with current flowing to ground. FIG. 8 also depicts a pulse 68 above the DC voltage $V_1$ that can also trigger the tube 64 as in a 2 pin device to provide a 'clock edge trigger' to what would normally be an asynchronous event.

Just because the Vout increases does not mean it must trigger the tube 64. It may have to happen because the bias is high enough that when coupled to the $V_1$+trigger pulse 68, the tube 64 excites.

In that case, a voltage developed across the load 66 can be sufficient to trigger a second set of tubes 64 as depicted in FIG. 8. This set of tubes 64 might be up in the kilo-volt and kilo-amp regime as $V_2$ can be quite large. Note that $V_2$ does not necessarily equal $V_1$.

Figure 9:
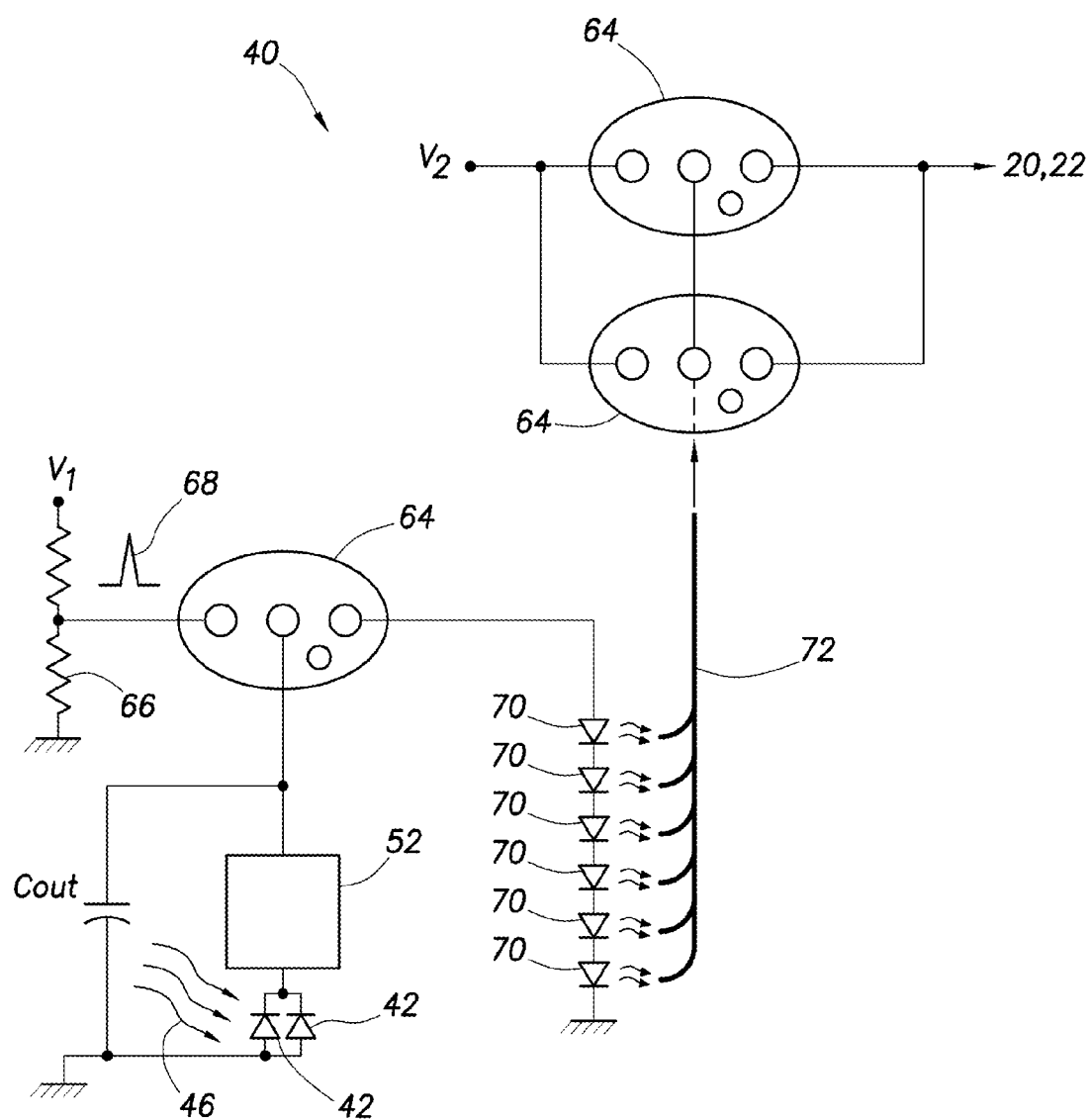

In FIG. 9, the second set of tubes 64 is triggered by a photonic trigger event. The triggering photons are produced by a series of light emitting diodes 70 connected to the output of the first tube 64. A light pipe or other optical waveguide 72 is used to direct the optical output of the light emitting diodes 70 to one of the second set of tubes 64.

The second set of tubes 64 can be caused to excite by the addition of photons (electrons) if already biased near their avalanche point. Since the plasma of an arc is conductive, triggering one tube 64 with electrodes of multiple tubes interconnected can also trigger the multiple tubes for current or voltage gain as in a cascade (series—not shown) or parallel string (shown).

Figure 10:
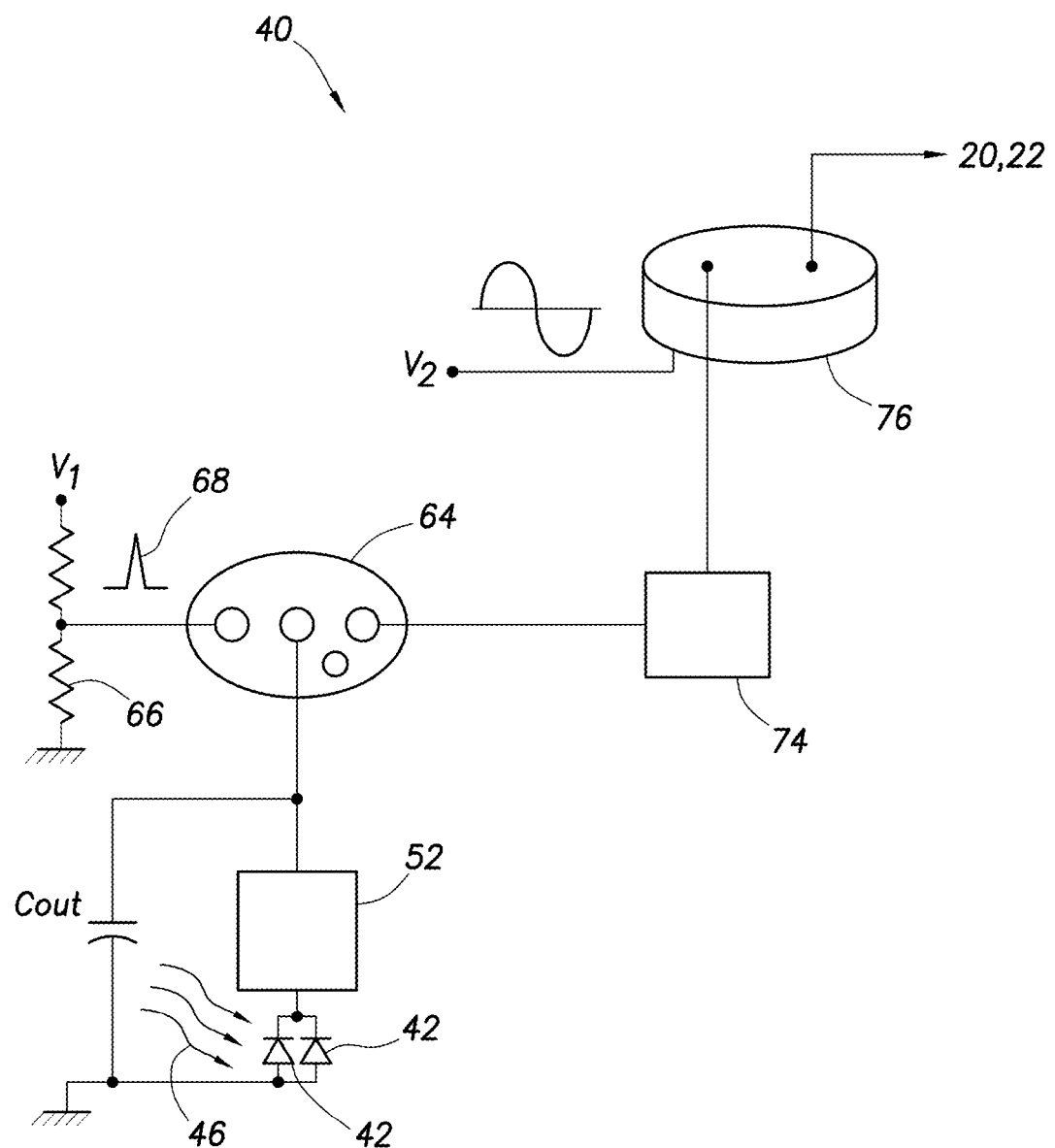

In the FIG. 10 example, the output of the tube 64 is directed to a wave shaping network 74 to provide the correct drive to a "hockey puck" SCR or TRIAC 76 to switch a large AC or DC source to a load. The wave shaping would be used for recurrent pulses to drive a device into 'proper' conduction and possibly cause the trigger voltage to have careful limits on drive and current levels to protect the device.

Figure 11:
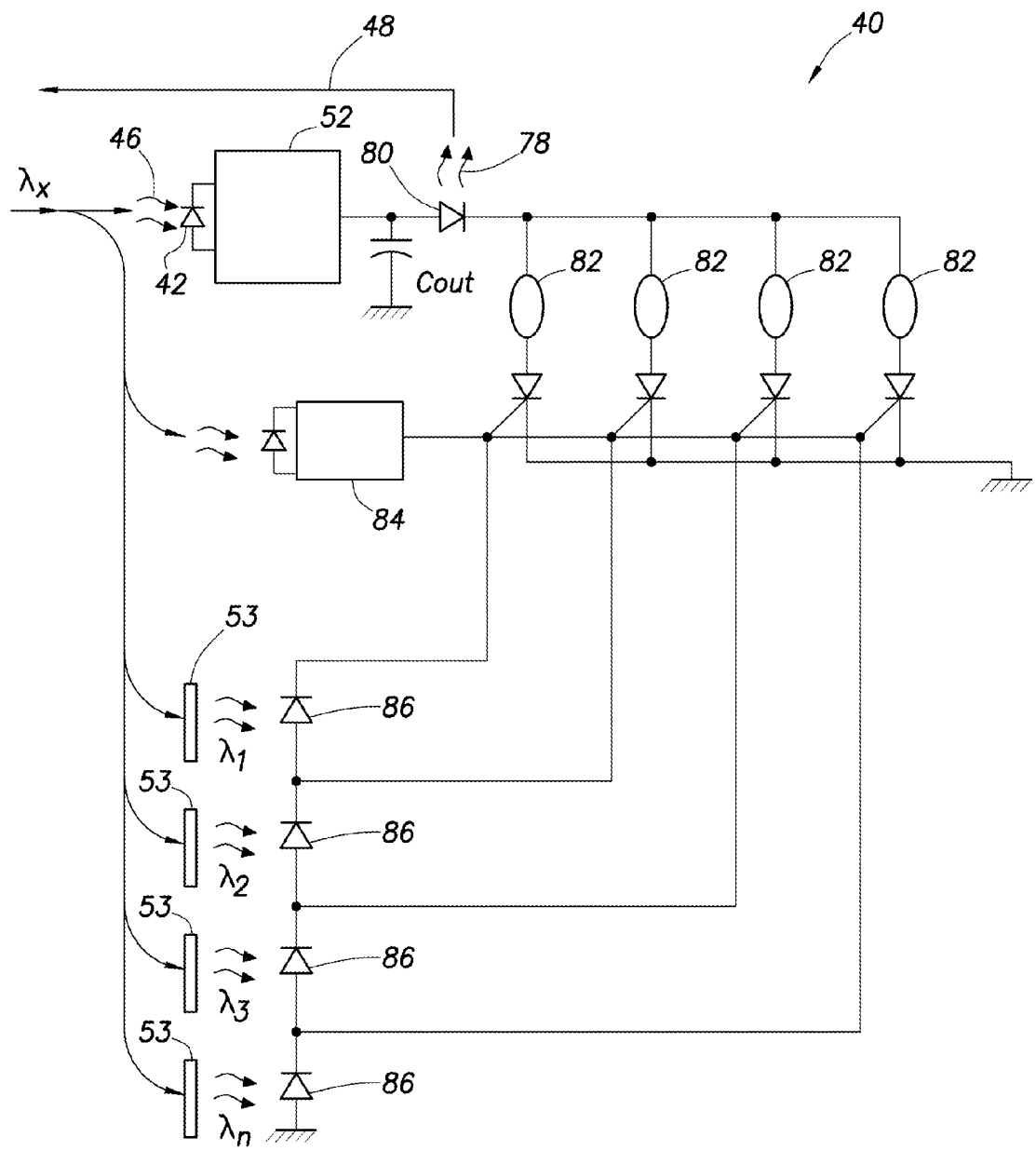

In the FIG. 11 example, an optical signal 78 is returned via the optical waveguide 48 (or another optical waveguide) to indicate what and when a trigger event occurs. For example, an electrical to optical converter 80 (such as a light emitting diode) may be used to produce the signal 78 when each of several devices 82 (such as perforating gun detonators, valve actuators, etc.) is supplied with electrical power.

In other examples in which the tubes 62 or 64 are used for triggering control, the tube(s) may include additional wavelength shaping gasses to produce wavelength-specific optical signals 78 to indicate a triggering event, in which case an electrical to optical conversion may not be needed. For example, the tubes 62, 64 could include a gas mixture tailored to produce enhanced infrared output for use in the signals 78.

A logic circuit 84 may be used to control when/if each device 82 is supplied with electrical power to operate/actuate the device. Alternatively, or in addition, optical filters 53 may be used to control when respective photodiodes 86 produce electrical current to thereby cause operation/actuation of each device 82.

Note that the energy to fire or trigger any of the circuit 40 examples described above does not have to come from conversion of light energy. In some examples, some or all of the energy delivered to the well tools 20, 22 or used to trigger the circuit 40 could be provided by capacitors charged before the circuit is installed downhole, high temperature batteries (such as lithium thionyl chloride batteries) or other stored energy sources.

The circuit 40 examples described above can be triggered to deliver electrical power to the well tools 20, 22, whether or not any or all of the electrical power is derived from converting light energy to electrical energy. Thus, the photodiode 42 and voltage doubler 52 may not be used in some examples.

The circuit 40 can be triggered to deliver electrical power to the well tools 20, 22 in response to one or more optical waveguides 48 supplying photons to a trigger device (such as, the photodiode 60, tubes 62, 64, SCR or TRIAC 76, etc.). An optical-to-excitation conversion, such as, in optical to Selenium crystals, or optical to Krytron, or optical to resonant cavity, may be used to trigger the delivery of electrical power.

It may now be fully appreciated that the above disclosure provides significant advancements to the art of implementing optical waveguides in well for providing electrical power to operate/actuate well tools. In examples described above, optical power is effectively converted to electrical power downhole. The electrical power can be stored and released quickly for short bursts to operate high power devices.

The energy release can be controlled optically from the earth's surface or another remote location. For example, in the FIGS. 4 & 11 examples, a particular wavelength of light may be transmitted to cause electrical power to be supplied to the well tool 20, 22 or to selected one(s) of the device(s) 82.

The circuit 40 can be multiplexed. Multiple units can be selectively powered and operated over a single optical cable 12.

Because relatively few, rugged, high temperature-capable electrical components are used, an operating range of the downhole well tools 20, 22 is enhanced. In some examples, no electrical conductors may be needed in the cable 12.

A circuit 40 for supplying electrical power to at least one downhole well tool 20, 22 is described above. In one example, the circuit 40 can comprise: a photodiode 42 which receives light 46 from an optical waveguide 48 in a well, a voltage increaser 52 which increases a voltage output by the photodiode 42, and an electrical energy storage device Cout which receives electrical energy via the voltage increaser 52, whereby the electrical power can be supplied to the downhole well tool 20, 22 from the storage device Cout.

The storage device Cout may comprise a capacitor.

The voltage increaser 52 may comprise at least one of a step up transformer 44 and a voltage doubler 50. The storage device Cout can comprise a capacitor of the voltage doubler 50.

The circuit 40 may include an optical filter 53 which permits only a selected range of wavelengths of the light 46 to be received by the photodiode 42. The photodiode 42 may produce the voltage output only when a selected range of wavelengths of the light 46 is received by the photodiode 42.

The circuit 40 may include a gas discharge tube 54 which permits the electrical power to be supplied to the downhole well tool 20, 22 only when a voltage output of the storage device Cout is above a selected threshold.

The circuit 40 can include a switchable diode 56 which permits the electrical power to be supplied to the downhole well tool 20, 22 only when a gate of the switchable diode 56 is activated. The gate may be activated in response to a triggering light 58 being received by a triggering photodiode 60.

The circuit 40 can include a gas discharge tube 62, 64 which permits the electrical power to be supplied to the downhole well tool 20, 22 only when an electrode of the gas discharge tube 62, 64 is energized. The electrode may be energized in response to a triggering light 58 being received by a triggering photodiode 60. The electrode may be energized in response to an electrical triggering pulse 68 being transmitted to the electrode.

An output of the gas discharge tube 64 can be connected to one or more electrodes of a second at least one gas discharge tube 64.

An output of the gas discharge tube 64 can be connected to one or more light emitting diodes 70 which supply optical energy to a second at least one gas discharge tube 64.

An output of the gas discharge tube 64 can be connected to a wave shaping network 74, and an output of the wave shaping network 74 can be connected to an SCR or TRIAC device 76.

An optical signal 78 may be transmitted in response to the electrical power being supplied to the downhole well tool 20, 22. The optical signal 78 may be transmitted via the optical waveguide 48.

The circuit 40 may comprise a logic circuit 84 which prevents the electrical power from being supplied to the well tool 20, 22, unless the light 46 has predetermined characteristics. The logic circuit 84 may permit the electrical power to be supplied to selected ones of multiple well tools 20, 22, based on the characteristics of the light 46.

The circuit 40 can include multiple optical filters 53 which prevent the electrical power from being supplied to the well tools 20, 22, unless the light 46 has predetermined characteristics. The optical filters 53 may permit the electrical power to be supplied to respective ones of the well tools 20, 22, based on the characteristics of the light 46.

A method of controlling electrical power delivery to a well tool 20, 22 is described above. In one example, the method can comprise: transmitting trigger light 58 via an optical waveguide 48 to a circuit 40 in a well; and the circuit 40 delivering the electrical power to the well tool 20, 22 in response to the circuit 40 receiving the trigger light 58.

The delivering step may be performed only when the trigger light 58 is pulsed within a predetermined frequency range, or only when the trigger light 58 is within a predetermined wavelength range.

The circuit 40 may deliver the electrical power from an electrical energy storage device (such as capacitor Cout, a downhole battery, etc.) to the well tool 20, 22.

The method may include converting light energy to electrical energy, and storing the electrical energy in the electrical energy storage device. Some or all of the electrical power delivered to the well tool 20, 22 may be converted from optical energy, or it may not be converted from optical energy.

A method of optical distributed sensing in a well and supplying electrical power to at least one well tool 20, 22 is also provided to the art by the above disclosure. In one example, the method can comprise: launching light 46 into an optical waveguide 48 in the well; in response to the launching, receiving indications of at least one parameter (e.g., temperature, acoustic energy, vibration, strain, etc.) as distributed along the optical waveguide 48; and converting at least a portion of the light 46 to electrical energy in the well, thereby supplying the electrical power to the well tool 20, 22.

The step of receiving indications may include detecting optical backscattering in the optical waveguide 48.

A method of supplying electrical power to at least one well tool 20, 22 is also described above. In one example, the method comprises: a photodiode 42 receiving light 46 from an optical waveguide 48 in a well; a voltage increaser 52 increasing a voltage output by the photodiode 42; and an electrical energy storage device Cout receiving electrical energy via the voltage increaser 52, and selectively supplying the electrical power to the well tool 20, 22 from the storage device Cout.

The electrical power may be supplied to the well tool 20, 22 only when the light 46 is pulsed within a predetermined frequency range. The electrical power may be supplied to the downhole well tool 20, 22 from the storage device in response to a trigger light 58 being pulsed within a predetermined frequency range.

Although various examples have been described above, with each example having certain features, it should be understood that it is not necessary for a particular feature of one example to be used exclusively with that example. Instead, any of the features described above and/or depicted in the drawings can be combined with any of the examples, in addition to or in substitution for any of the other features of those examples. One example's features are not mutually exclusive to another example's features. Instead, the scope of this disclosure encompasses any combination of any of the features.

Although each example described above includes a certain combination of features, it should be understood that it is not necessary for all features of an example to be used. Instead, any of the features described above can be used, without any other particular feature or features also being used.

It should be understood that the various embodiments described herein may be utilized in various orientations, such as inclined, inverted, horizontal, vertical, etc., and in various configurations, without departing from the principles of this disclosure. The embodiments are described merely as examples of useful applications of the principles of the disclosure, which is not limited to any specific details of these embodiments.

In the above description of the representative examples, directional terms (such as "above," "below," "upper," "lower," etc.) are used for convenience in referring to the accompanying drawings. However, it should be clearly understood that the scope of this disclosure is not limited to any particular directions described herein.

The terms "including," "includes," "comprising," "comprises," and similar terms are used in a non-limiting sense in this specification. For example, if a system, method, apparatus, device, etc., is described as "including" a certain feature or element, the system, method, apparatus, device, etc., can include that feature or element, and can also include other features or elements. Similarly, the term "comprises" is considered to mean "comprises, but is not limited to."

Of course, a person skilled in the art would, upon a careful consideration of the above description of representative embodiments of the disclosure, readily appreciate that many modifications, additions, substitutions, deletions, and other changes may be made to the specific embodiments, and such changes are contemplated by the principles of this disclosure. For example, structures disclosed as being separately formed can, in other examples, be integrally formed and vice versa. Accordingly, the foregoing detailed description is to be clearly understood as being given by way of illustration and example only, the spirit and scope of the invention being limited solely by the appended claims and their equivalents.

What is claimed is:

1. A method of controlling electrical power delivery to a well tool, the method comprising:
   broadcasting light through an interrogator, wherein the interrogator comprises a photo-detector;
   converting light energy to electrical energy in a well;
   storing the electrical energy downhole in an electrical energy storage device;
   then transmitting a trigger light via an optical waveguide to a circuit in the well;
   closing the circuit with the trigger light to release the electrical energy downhole from the electrical energy storage device; and
   the circuit delivering the stored electrical energy to the well tool in response to the circuit receiving the trigger light.

2. The method of claim 1, wherein the delivering is performed only when the trigger light is pulsed within a predetermined frequency range.

3. The method of claim 1, wherein the delivering is performed only when the trigger light is within a predetermined wavelength range.

4. The method of claim 1, wherein the circuit delivers the stored electrical energy from the electrical energy storage device to the well tool.

* * * * *